(12) United States Patent
Won et al.

(10) Patent No.: US 6,625,062 B2
(45) Date of Patent: Sep. 23, 2003

(54) FLASH MEMORY DEVICE

(75) Inventors: Sam Kyu Won, Busan-Shi (KR); Min Kyu Kim, Kyungki-Do (JP)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/071,226

(22) Filed: Feb. 11, 2002

(65) Prior Publication Data

US 2003/0099133 A1 May 29, 2003

(30) Foreign Application Priority Data

Nov. 23, 2001 (KR) ........................................ 2001-73422

(51) Int. Cl.[7] ............................................... G11C 16/06
(52) U.S. Cl. ............................ 365/185.21; 365/185.2; 365/185.33
(58) Field of Search ......................... 365/185.21, 185.2, 365/185.33

(56) References Cited

U.S. PATENT DOCUMENTS

| 5,321,655 A | * | 6/1994 | Iwahashi et al. | ....... 365/185.21 |
| 6,191,979 B1 | * | 2/2001 | Uekubo | .................. 365/185.2 |

* cited by examiner

Primary Examiner—Huan Hoang
(74) Attorney, Agent, or Firm—Morgan, Lewis & Bockius LLP

(57) ABSTRACT

A flash memory device according to the present invention comprises: a memory cell array having a plurality of memory cells; a dummy cell array having a plurality of dummy cells and connected to each word line of the memory cell array; a means for applying a voltage to a bit line of the dummy cell array; a level detector for detecting potential of the bit line in the dummy cell array; a row decoder for selecting a word line of the dummy cell array and the memory cell array according to an address signal; and a column decoder for selecting a bit line of the memory cell array according to the address signal; a sense amplifier enabled by an output of the level detector and for comparing data stored on the cell of the memory cell array with data stored on a reference cell.

8 Claims, 4 Drawing Sheets

FLASH MEMORY DEVICE

FIELD OF THE INVENTION

This invention relates to a flash memory device, and more particularly to a flash memory device which can accurately read data in spite of change of a load according to position of a memory cell and change of a process, and can improve operation speed of the device by reliably enabling the sense amplifier without time delay by generating an enable signal for a sense amplifier using a flash memory cell.

BACKGROUND OF THE INVENTION

FIG. 1 is a block diagram of a flash memory device including a conventional sense amplifier and its drive circuit and FIG. 2 depicts waveforms of each output signal according to read operation of a memory cell.

An address ADD being inputted through an address buffer 11 is inputted to an address transition detecting circuit 12, a row decoder 14 and a column decoder 15. The address transition detecting circuit 12 detects transition of the address and outputs an address transition detecting signal ATD. A delay circuit 13 delays the address transition detecting signal ATD for a predetermined time and outputs a sense amplifier enable signal SAEN for enabling a sense amplifier 18. A row decoder 14 outputs a word line signal WL depending on the address signal ADD and a word line of a memory cell array 16 is selected by the word line signal WL. A column decoder 15 outputs a bit line selection signal B1sel to drive a NMOS transistor and a bit line of the memory cell array 16 is selected by the bit line selection signal B1sel. One cell is selected by outputs of the row decoder 14 and column decoder 15, and data stored on the selected cell is inputted to an inverting terminal (–) of the sense amplifier 18. The sense amplifier 18 compares data SAIN1 stored on the selected cell, which is inputted to the inverting terminal (–) thereof, with data SAIN2 stored on a reference cell, which is inputted to an non inverting terminal (+) thereof and outputs output data SAOUT. The output data SAOUT is outputted to the outside DOUT.

The flash memory device including the sense amplifier and its drive circuit configured as described above makes the access time change during the sense amplifier is enabled and outputs sensing data to an output buffer. The sense amplifier enable signal is outputted from the delay circuit which delays the address transition detecting signal. Since the enable signal is generated by delaying the address transition detecting signal, the sense amplifier outputs error data by change of a load according to position of a memory cell and change of a process.

SUMMARY OF THE INVENTION

Therefore, it is an object of the present invention to provide a flash memory device which can read accurate data in spite of change of a load according to position of a memory cell and change of a process.

Another object of the present invention is to provide a flash memory cell which can improve operation speed of the device by reliably enabling a sense amplifier without time delay using a flash memory cell. To achieve the above objects, a flash memory device according to the present invention comprises:

- a memory cell array having a plurality of memory cells;
- a dummy cell array having a plurality of dummy cells and connected to each word line of said memory cell array;

- means for applying a voltage to a bit line of said dummy cell array;
- a level detector for detecting potential of the bit line in said dummy cell array;
- a row decoder for selecting a word line of said dummy cell array and said memory cell array according to an address signal; and
- a column decoder for selecting a bit line of said memory cell array according to said address signal;
- a sense amplifier enabled by an output of said level detector and for comparing data stored on said cell of said memory cell array with data stored on a reference cell.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE PRESENT INVENTION

Figure 1:
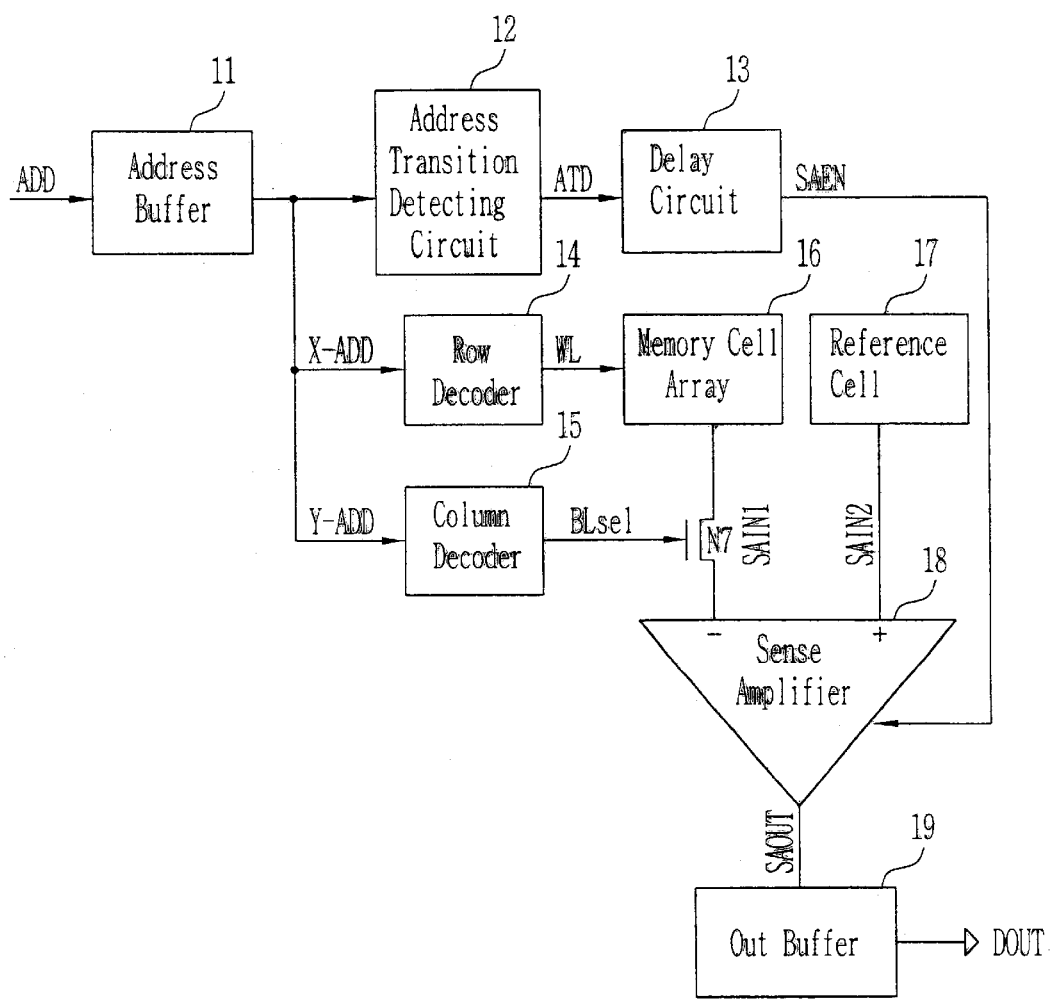
FIG. 1 is a block diagram of a flash memory device including a conventional sense amplifier and its drive circuit.
Figure 2:
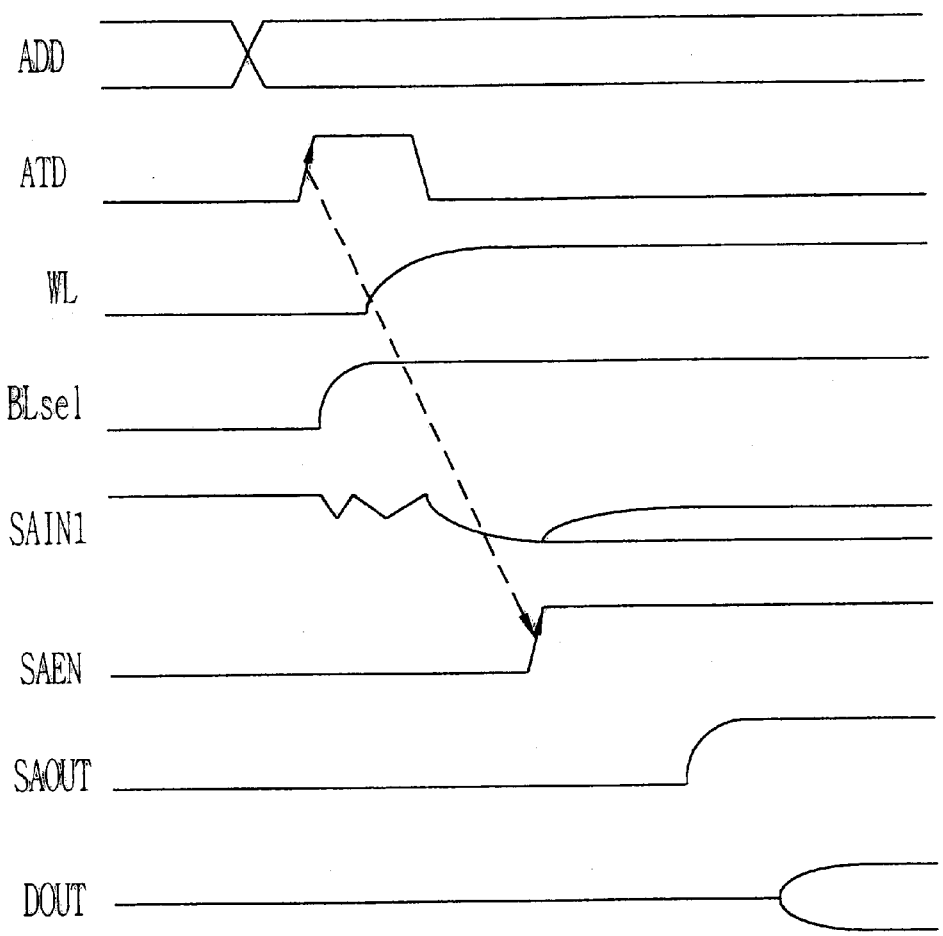
FIG. 2 depicts waveforms of each output signal according to read operation of a memory cell of FIG. 1.

The present invention will be described in detail by way of preferred embodiments with reference to accompanying drawings, in which like reference numerals are used to identify the same or similar parts.

Figure 3:
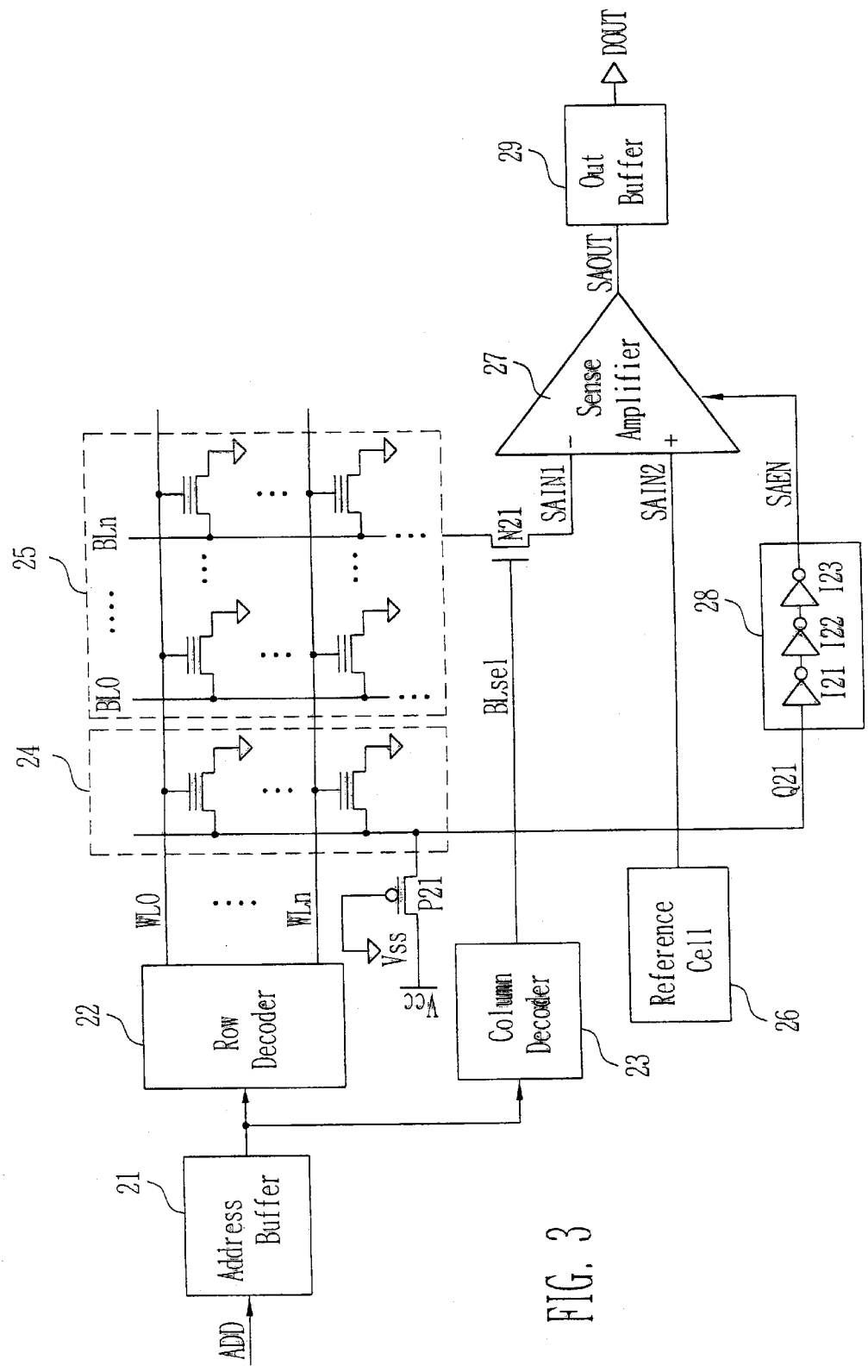
FIG. 3 is a block diagram of a flash memory device including a sense amplifier and its drive circuit according to an embodiment of the present invention.

FIG. 3 is a block diagram of a flash memory device including a sense amplifier and its drive circuit according to an embodiment of the present invention.

A word line of a dummy cell array 24 and a memory cell array 25 is selected by the word line signal WL0 to WLn. The dummy cell array 24 has a plurality of dummy cells, each cell of which is connected to the word line of the memory cell one by one. The dummy cells maintains a program state or a erase state. In the dummy cell array 24, a pull-up load, for example, a PMOS transistor P21 maintaining a turn on state by a ground voltage, is connected between a bit line Q21 and a power supply terminal Vcc. A level detector 28 detects potential of a bit line in the dummy cell array 24 and outputs a sense amplifier enable signal SAEN to drive a sense amplifier 27 by buffering the detected potential. The level detector 28 has a plurality of inverters I21 to I23 so that the potential of the bit line Q21 in the dummy cell array 24 is inverted and delayed if the dummy cell maintains an erase state. Also, the level detector 28 may be constructed to delay the potential of the bit line Q21 in the dummy cell array 24 if the dummy cell maintains a program state. The column decoder 23 generates a bit line selection signal B1sel depending on whether the address signal ADD and a NMOS transistor N21 is turned on by the bit line selection signal B1sel, thereby selecting a bit line of the memory cell array 25.

If a cell is selected by outputs of the row decoder 22 and the column decoder 23, data stored on the selected cell is inputted to an inverting terminal (−) of the sense amplifier 27. The sense amplifier 27 compares data SAIN1 stored on the selected cell, which is inputted to the inverting terminal (−) thereof, with data SAIN2 stored on a reference cell, which is inputted to an non inverting terminal (+) thereof and outputs output data SAOUT. The output data SAOUT is outputted to the outside DOUT.

The dummy cell array 24 becomes a poor state according to the loading and the process of the memory cell since the dummy cell array 24 is disposed at the edge of the memory cell array. Therefore, if the sense amplifier enable signal is generated with reference to the dummy cell, time for transferring data of the memory cell through the bit line can reliably be set.

Figure 4:
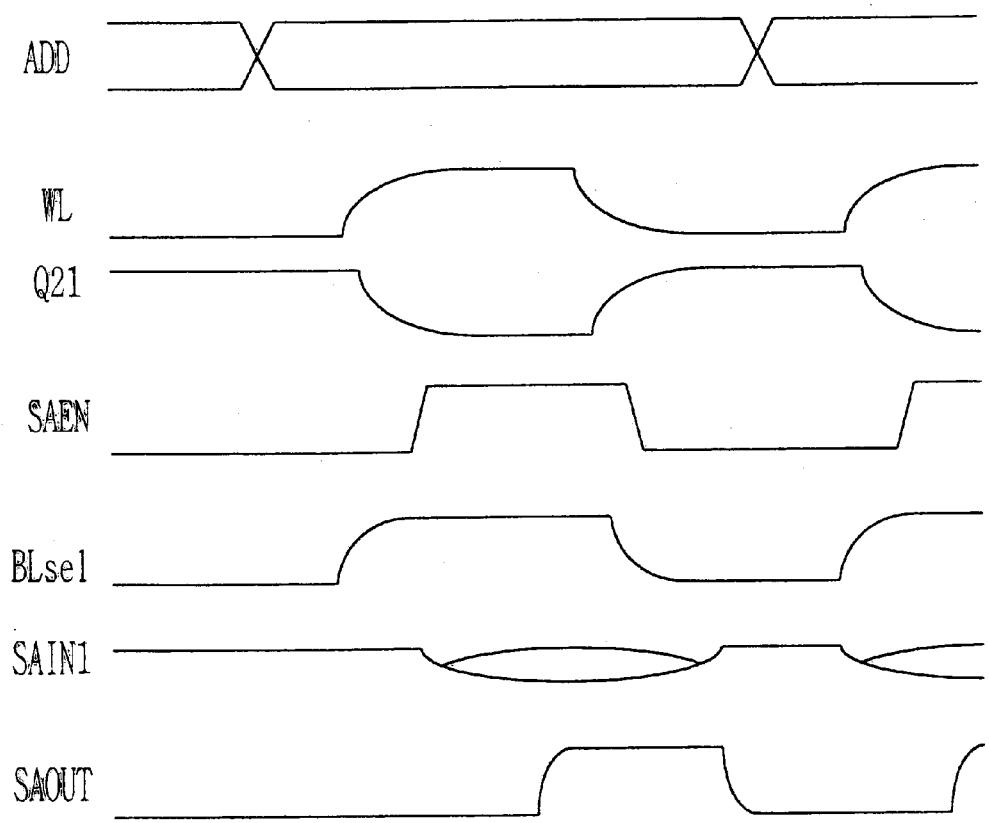
FIG. 4 depicts waveforms of each output signal according to read operation of a memory cell of FIG. 3.

Operation of the flash memory cell including the sense amplifier and its drive circuit according to the present invention will be explained with reference to the waveforms depicted in FIG. 4.

A supply voltage Vcc is applied to the bit line Q21 of the dummy cell array 24, through the PMOS transistor P21, so that the bit line Q21 maintains a high state, that is, the supply voltage Vcc. Potential of the bit line Q21 in the dummy cell array 24, which maintains a high state, is transferred to the level detector 28 having first to third inverter I21 to I23 to generate the sense amplifier enable signal SAEN. Accordingly, the sense amplifier 27 is disabled by the sense amplifier enable signal SAEN having a low state.

If an address signal ADD is inputted through an address buffer 21, a row decoder 22 and a column decoder 23 outputs a word line signal WL and a bit line signal B1sel, respectively. A word line of the dummy cell array 24 and a memory cell array 25 is selected by the word line signal WL outputted from the row decoder 22. If the word line of the dummy cell array 24 is selected by the word line signal WL, a current path passing through the dummy cell maintaining an erase state is formed and potential of the bit line Q21 maintains a low state. The potential of the bit line Q21 maintaining a low state is inverted by the level shifter having first to third inverters I21 to I23 to generate a sense amplifier enable signal SAEN. The sense amplifier 27 is enabled by the sense amplifier enable signal SAEN. A bit line of the memory cell array 25 is selected by the bit line selection signal B1sel outputted from the column decoder 23 to select a cell of the memory cell array 25. Data SAIN1 stored on the selected cell is inputted to an inverting terminal (−) of the sense amplifier 18. The sense amplifier 27 compares data SAIN1 stored on the selected cell, which is inputted to the inverting terminal (−) thereof, with data SAIN2 stored on a reference cell, which is inputted to an non inverting terminal (+) thereof and outputs data SAOUT. The output data SAOUT is outputted to the outside DOUT.

In the mean time, if the dummy cell of the dummy cell array 24 maintains a program state, the level detector 28 must be constructed in the even number inverters to buffer the potential of the bit line Q21 in the dummy cell array 24.

Accordingly, if a word line of the dummy cell array 24 and the memory cell array 25 is selected by the word line signal WL outputted from the row decoder 22, the potential of the bit line Q21 of the dummy cell array 24 maintains a high level since the dummy cell maintains a program state a current path to a ground terminal Vss is not formed. The level detector 28 outputs the sense amplifier enable signal SAEN to enable the sense amplifier 27 according to the potential of the bit line Q21 in the dummy cell array 24.

As described above, according to the present invention, the sense amplifier enable signal reads a memory cell of the flash memory device generated by the dummy cell, so that the processing burden caused by the change of the load and the process is reduced and the sense amplifier is reliably enabled to improve speed of the device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device comprising:
    a memory cell array having a plurality of memory cells;
    a dummy cell array having a plurality of dummy cells and connected to each word line of said memory cell array;
    means for applying a voltage to a bit line of said dummy cell array;
    a level detector for detecting potential of the bit line in said dummy cell array;
    a row decoder for selecting a word line of said dummy cell array and said memory cell array according to an address signal; and
    a column decoder for selecting a bit line of said memory cell array according to said address signal;
    a sense amplifier enabled by an output of said level detector and for comparing data stored on a memory cell of said memory cell array with data stored on a reference cell.

2. The device of claim 1, wherein said dummy cell array is constructed by a plurality of flash memory cells maintaining an erase state.

3. The device of claim 1, wherein said dummy cell array is constructed by a plurality of flash memory cells maintaining a program state.

4. The device of claim 1, wherein said means for applying a voltage to a bit line of said dummy cell array is a PMOS transistor which is connected between a power supply terminal and said bit line of said dummy cell array and turned on by a ground voltage.

5. The device of claim 1, wherein said level detector comprises:
    means for inverting potential of said bit line in said dummy cell array; and means for buffering output of said inverting means.

6. The device of claim 1, wherein said level detector comprises:
    means for buffering potential of said bit line in said dummy cell array.

7. A method of reading data in flash memory device, the method comprising:
    providing in an array a plurality of memory cells;
    connecting to each word line of said plurality of memory cells a plurality of dummy cells in an array;
    applying a voltage to a bit line of said array of dummy cells;
    detecting potential of the bit line in said array of dummy cells;
    selecting a word line of said arrays of dummy cells and memory cells according to an address signal; and
    selecting a bit line of said array of memory cells according to said address signal;
    enabling a sense amplifier by said potential of the bit line in said array of dummy cells, and comparing data stored on a memory cell of said array of memory cells with data stored on a reference cell.

8. The method of claim 7, wherein said detecting potential of the bit line in said array of dummy cells comprises inverting potential of said bit line in said dummy cell in an array and buffering output of said inverting potential.

* * * * *